(12) United States Patent
Kim

(10) Patent No.: US 7,364,979 B2
(45) Date of Patent: Apr. 29, 2008

(54) CAPCITOR WITH SINGLE CRYSTAL TANTALUM OXIDE LAYER AND METHOD FOR FABRICATING THE SAME

(75) Inventor: Do-Hyung Kim, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 11/411,568

(22) Filed: Apr. 25, 2006

(65) Prior Publication Data

US 2007/0001204 A1 Jan. 4, 2007

(30) Foreign Application Priority Data

Jun. 30, 2005 (KR) .......................... 2005-0058566

(51) Int. Cl.
*H01L 21/20* (2006.01)

(52) U.S. Cl. .................. 438/396; 438/238; 438/239; 438/381; 438/387; 257/E21.008; 257/E21.396; 257/E27.048

(58) Field of Classification Search ................ 257/296, 257/E21.008, E27.04, E21.396; 438/396
See application file for complete search history.

(56) References Cited

U.S. PATENT DOCUMENTS 5,785,838 A * 7/1998 Sugimura et al. ............. 205/83
5,888,371 A * 3/1999 Quate .......................... 205/122
6,110,598 A * 8/2000 Maeda et al. ................ 428/457
6,433,379 B1 * 8/2002 Lopatin et al. .............. 257/301
2001/0016394 A1 * 8/2001 Koyanagi et al. ........... 438/396
2001/0038114 A1 * 11/2001 Iljima et al. ................. 257/303
2005/0032346 A1 * 2/2005 Graettinger ................. 438/610
2005/0051829 A1 * 3/2005 Goto et al. .................. 257/310

OTHER PUBLICATIONS

Physica B 352 (2004) 190-199, anolithography and nanoindentation of tantalum-oxide nanowires and nanodots using scanning probe microscopy.

* cited by examiner

*Primary Examiner*—B. William Baumeister
*Assistant Examiner*—Igwe U. Anya
(74) *Attorney, Agent, or Firm*—Blakely, Sokoloff, Taylor & Zafman LLP

(57) ABSTRACT

A capacitor and a method for fabricating the same are provided. The capacitor includes: a substrate; an inter-layer insulation layer formed over the substrate and including a contact hole; a storage node formed over the inter-layer insulation layer and filled into the contact hole; a tantalum oxide layer of single crystal formed over the storage node; and a plate formed over the tantalum oxide layer.

9 Claims, 6 Drawing Sheets

CAPCITOR WITH SINGLE CRYSTAL TANTALUM OXIDE LAYER AND METHOD FOR FABRICATING THE SAME

FIELD OF THE INVENTION

The present invention relates to a method for fabricating a semiconductor device; and more particularly, to a capacitor and a method for fabricating the same.

DESCRIPTION OF RELATED ARTS

Recently, as the minimum line width of a semiconductor device has decreased and the scale of integration of the semiconductor device has increased, the area in which a capacitor may be formed has also decreased. Although the area in which the capacitor is formed is smaller, the capacitor should secure a high capacitance of 25 pF required per cell as a minimum and leakage current generated from the capacitor itself should be decreased.

To form a capacitor having a high capacitance in such a limited area, an area in which the capacitor is formed should be structurally secured or an effective thickness (Tox) of a dielectric layer should be decreased. In addition, a method for using a dielectric layer having a high dielectric constant has been suggested.

Furthermore, it is possible to reduce an amount of a leakage current through an interface of a crystal by using a single crystalline dielectric layer having a high dielectric constant instead of using a polycrystalline dielectric layer.

In the prior art, the height of the capacitor is increased to secure a sufficient capacitance as a method to increase an area in which the capacitor is formed. However, the ability to increase the height of the capacitor is limited. Accordingly, a capacitor using hafnium oxide ($HfO_2$) and aluminum oxide ($Al_2O_3$) having a high dielectric constant as a dielectric layer has been suggested.

However, $HfO_2$ and $Al_2O_3$ are amorphous structures, thereby having a dielectric constant ($\epsilon$) of 9. Thus, $HfO_2$ and $Al_2O_3$ can embody a capacitor having a higher capacitance than that of a capacitor using an ONO material. However, the ability to use $HfO_2$ and $Al_2O_3$ for this purpose is also limited.

FIGS. 1A and 1B are cross-sectional views briefly illustrating a typical method for fabricating a capacitor.

As shown in FIG. 1A, an inter-layer insulation layer 12 is formed over a substrate 11 and afterwards, a storage node (SN) stop layer 13 formed of nitride and a SN buffer layer 14 formed of oxide are sequentially formed over the inter-layer insulation layer 12.

Next, the SN buffer layer 14, the SN stop layer 13 and the inter-layer insulation layer 12 are sequentially etched, thereby forming a contact hole. Inside the contact hole, a SN contact 15 is formed. At this time, the SN contact 15 is formed through depositing polycrystalline silicon and performing an etch-back process.

Next, a SN undoped silicate glass (USG) layer 16 and a SN tetraethyl orthosilicate (TEOS) layer 17 are stacked on an entire surface of the above resulting structure in which the SN contact 15 is formed. Thereafter, a SN hard mask 18 formed of polycrystalline silicon is deposited over the SN TEOS layer 17. A photoresist layer is deposited over the SN hard mask 18 and then, the photoresist layer is patterned through a photo-exposure process and a developing process, thereby forming a SN mask (not shown). Next, the SN hard mask 18 is patterned by using the SN mask as an etch barrier.

Next, the SN mask is stripped and afterwards, a SN patterning process is performed by using the SN hard mask 18 as an etch barrier. At this time, the SN patterning process is a process forming a three dimensional type opening 19 in which a bottom electrode, i.e., a storage node, of a capacitor will be formed by etching the SN TEOS layer 17, the SN USG layer 16 and the SN buffer layer 14.

During performing the SN patterning process, an etching process is stopped at the SN stop layer 13.

As shown in FIG. 1B, the SN hard mask 18 is removed after the formation of the opening 19. At this time, an upper portion of the SN contact 15 is partially removed.

Next, a first SN barrier metal layer 20 formed of titanium (Ti) and a second barrier metal layer 21 formed of titanium nitride (TiN) are deposited over an entire surface of the opening 19. Afterwards, a bottom electrode isolation process is performed and thus, the first SN barrier metal layer 20 and the second SN barrier metal layer 21 remain only inside the opening 19.

Next, a dielectric layer 22 formed by sequentially stacking $HfO_2$, $Al_2O_3$, and $HfO_2$ is formed over an entire surface of the above resulting structure. Afterwards, a plate 23 formed of TiN is formed over the dielectric layer 22, thereby completing a capacitor.

However, a capacitor applying $HfO_2$ and $Al_2O_3$ of the typical method is formed through a complicated fabrication process. Also, there is a difficulty in a process because a height of the capacitor should be high enough to have a sufficient capacitance.

That is, in order to raise a height of a second SN barrier metal layer formed of TiN, a process of introducing a SN USG layer, a SN TEOS layer and a SN hard mask is required. Also, in order to prevent a structure beneath a SN contact from being damaged during the SN patterning process, it is required to introduce a SN stop layer.

Although the capacitor is formed by using $HfO_2$ and $Al_2O_3$ having a high dielectric constant of approximately 9 in the typical method, this dielectric layer cannot be satisfied with a capacitance required by the capacitor which has been highly integrated.

Accordingly, a dielectric layer and a capacitor having a higher dielectric constant than $HfO_2$ and $Al_2O_3$ and reducing a leakage current are required.

SUMMARY OF THE INVENTION

It is, therefore, an object of the present invention to provide a capacitor capable of securing a capacitance of approximately 25 pF and reducing an amount of a leakage current generated from the capacitor itself, and a method for fabricating the same.

In accordance with one aspect of the present invention, there is provided a capacitor of a semiconductor device, including: a substrate; an inter-layer insulation layer formed over the substrate and including a contact hole; a storage node formed over the inter-layer insulation layer and filled into the contact hole; a tantalum oxide layer of single crystal formed over the storage node; and a plate formed over the tantalum oxide layer.

In accordance with another aspect of the present invention, there is provided a method for fabricating a capacitor, including: forming an inter-layer insulation layer over a substrate; etching the inter-layer insulation layer to form a contact hole exposing a predetermined portion of the substrate; forming a storage node over the inter-layer insulation layer by filling the contact hole to serve as a storage node contact; forming a tantalum layer over the storage node;

transforming the tantalum layer into a tantalum oxide layer of single crystal; and forming a plate over the tantalum oxide layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

Figure 1A:
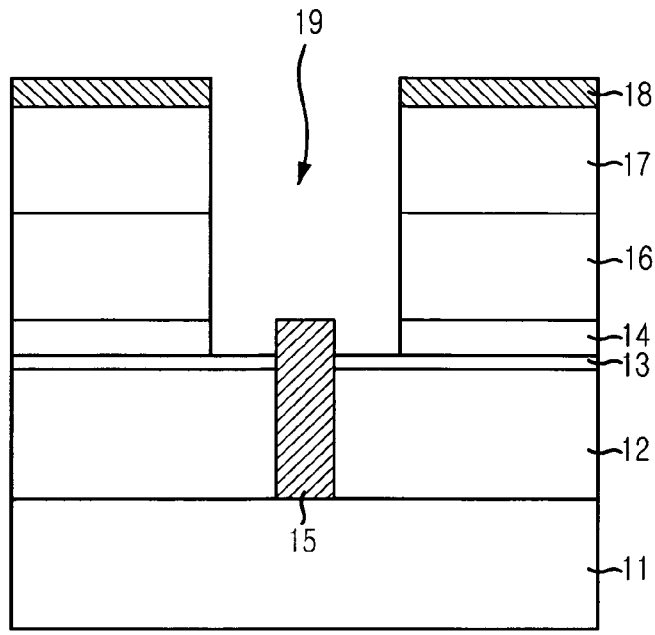
FIGS. 1A and 1B are cross-sectional views briefly illustrating a typical method for fabricating a capacitor.
Figure 1B:
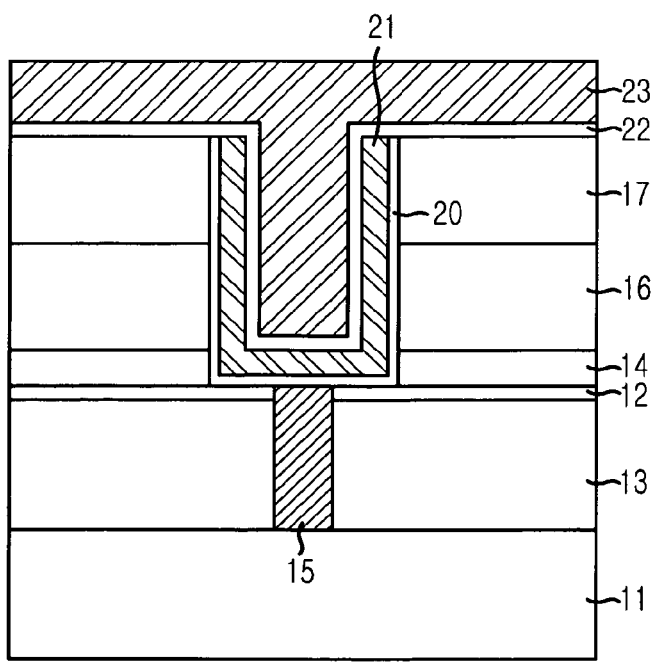
Figure 2:
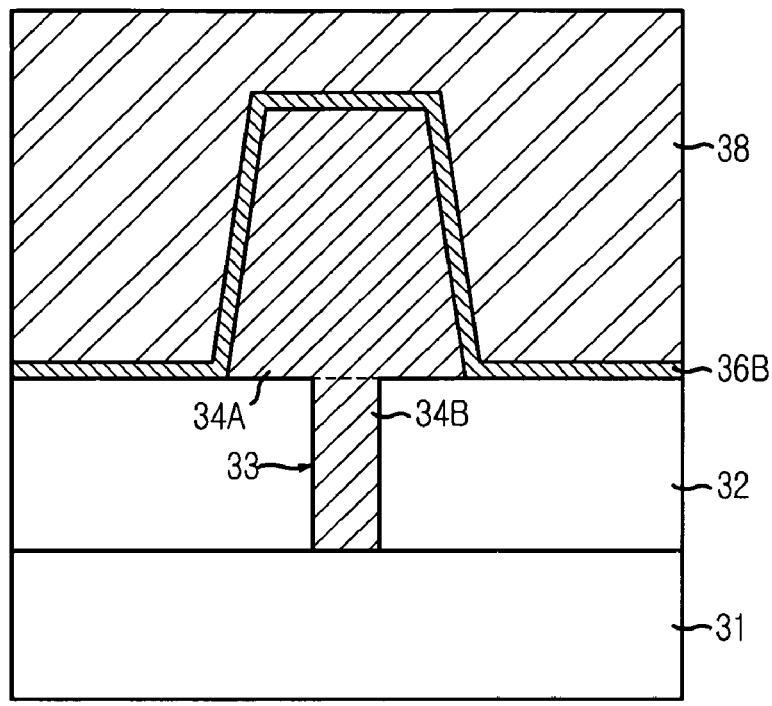
FIG. 2 is a cross-sectional view illustrating a capacitor in accordance with a specific embodiment of the present invention.

FIG. 2 is a cross-sectional view illustrating a capacitor in accordance with a specific embodiment of the present invention.

As shown in FIG. 2, the capacitor includes a substrate 31, an inter-layer insulation layer 32 formed over the substrate 31 and including a contact hole 33, a storage node 34A formed over the inter-layer insulation layer 32 and filled into the contact hole 33 of the inter-layer insulation layer 32 to serve as a storage node (SN) contact 34A, a planarized tantalum oxide layer 36B of single crystal formed over a surface of the storage node 34A, and a plate 38 formed over the planarized tantalum oxide layer 36B.

Herein, the planarized tantalum oxide layer 36B has a single crystal structure and is formed by oxidizing a tantalum layer. The storage node 34A and the plate 38 are formed using one of polycrystalline silicon, single crystal silicon, titanium nitride (TiN), titanium (Ti), ruthenium (Ru), and tungsten (W). The storage node 34A has sloped sidewalls in an angle ranging from approximately 5° to approximately 60°.

FIGS. 3A to 3H are cross-sectional views illustrating a method for fabricating a capacitor in accordance with a specific embodiment of the present invention. Herein, the same reference numerals shown in FIG. 2 denote the same elements in FIGS. 3A to 3H.

Figure 3A:
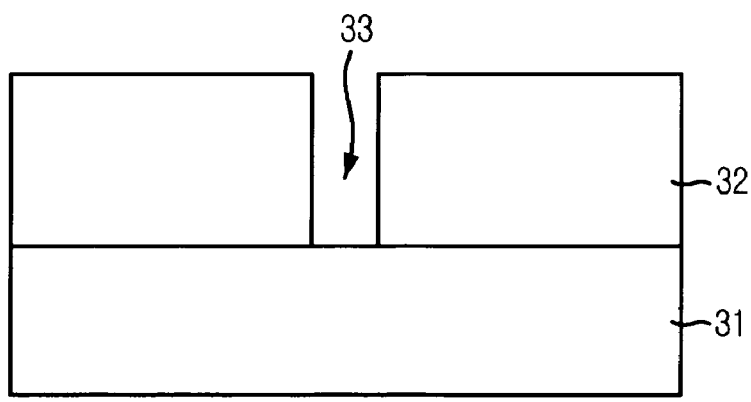
FIGS. 3A to 3H are cross-sectional views illustrating a method for fabricating a capacitor in accordance with a specific embodiment of the present invention.

Referring to FIG. 3A, an inter-layer insulation layer 32 is formed over a substrate 31. At this time, the inter-layer insulation layer 32 can be a multiple structure because although not shown, processes for forming transistors and bit lines are performed before the formation of the inter-layer insulation layer 32.

Next, the inter-layer insulation layer 32 is selectively etched, thereby forming a contact hole 33 exposing a predetermined portion of the substrate 31. Herein, the contact hole 33 serves a role in electrically connecting a bottom electrode of a subsequent capacitor with the substrate 31. In accordance with the specific embodiment of the present invention, the insulation structure providing the contact hole 33 does not includes a storage node (SN) stop layer formed of nitride and a SN buffer layer formed of oxide.

Figure 3B:
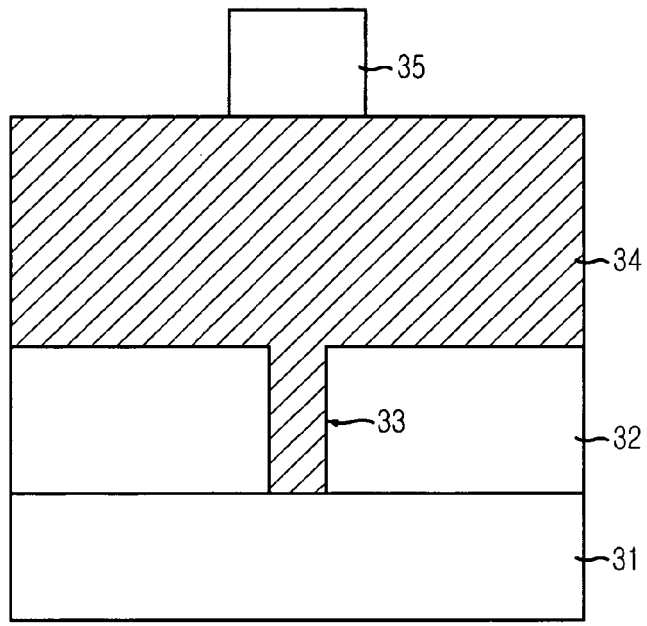

Referring to FIG. 3B, a polycrystalline silicon layer 34 is formed over an entire surface of the above resulting structure until the contact hole 33 is filled. At this time, the polycrystalline silicon layer 34 is formed in a thickness thick enough to simultaneously serve both roles as a SN contact and a bottom electrode by filling the contact hole 33. For instance, the polycrystalline silicon layer 34 is formed in a thickness of approximately 7,000 Å.

Next, a photoresist layer is formed over the polycrystalline silicon layer 34, and a SN mask 35 is formed through a photo-exposure process and a developing process. At this time, the SN mask 35 is formed in a region reverse to an open region, and a remaining portion of the polycrystalline silicon layer 34 after being etched by the SN mask 35 becomes a storage node (SN).

Figure 3C:
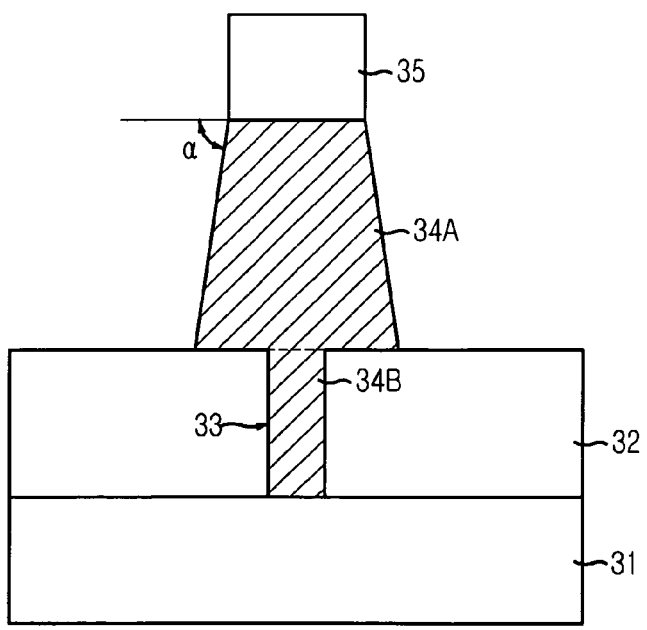

As shown in FIG. 3C, the polycrystalline silicon layer 34 is patterned using the SN mask 35 as an etch barrier to form the aforementioned storage node (SN). The storage node (SN) is formed in one structure serving role as a SN contact. Hereinafter, the polycrystalline silicon layer 34 subjected to the patterning will be referred to as a storage node 34A, and a portion filled in the contact hole 33 after the patterning will be referred to as a storage node (SN) contact 34B. Accordingly, the storage node 34A becomes one structure serving a role of the SN contact 34B.

According to the typical method, a polycrystalline silicon layer is subjected to an etch-back process and thus, only the SN contact is formed. However, in accordance with the specific embodiment of the present invention, the polycrystalline silicon layer 34 is patterned, thereby simultaneously forming the storage node 34A and the SN contact 34B. Accordingly, an etch-back process of the polycrystalline silicon layer 34 is not necessary in accordance with the embodiment of the present invention.

Sidewalls of the storage node 34A are patterned to make the storage node 34A have a slope ranging form approximately 5° to approximately 60°.

Figure 3D:
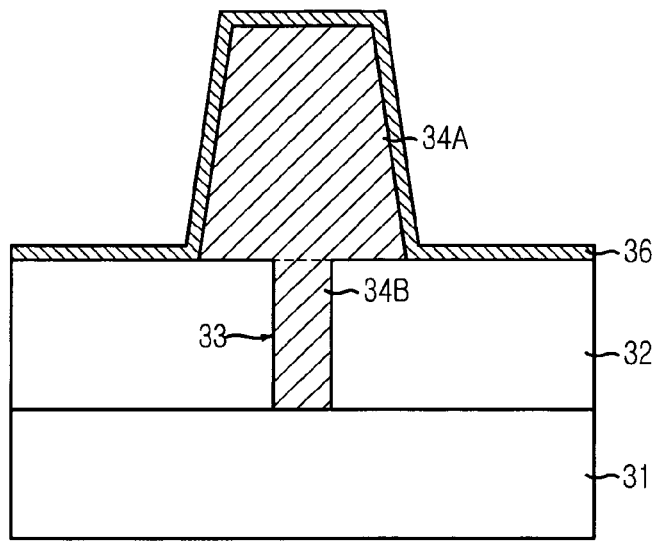

As shown in FIG. 3D, the SN mask 35 is removed and afterwards, a tantalum layer 36 is deposited over an entire surface including the storage node 34A.

At this time, the tantalum layer 36 is deposited in a thickness ranging from approximately 300 Å to approximately 1,000 Å through one of a sputtering method, a chemical vapor deposition (CVD) method, and an atomic layer deposition (ALD) method.

Figure 3E:
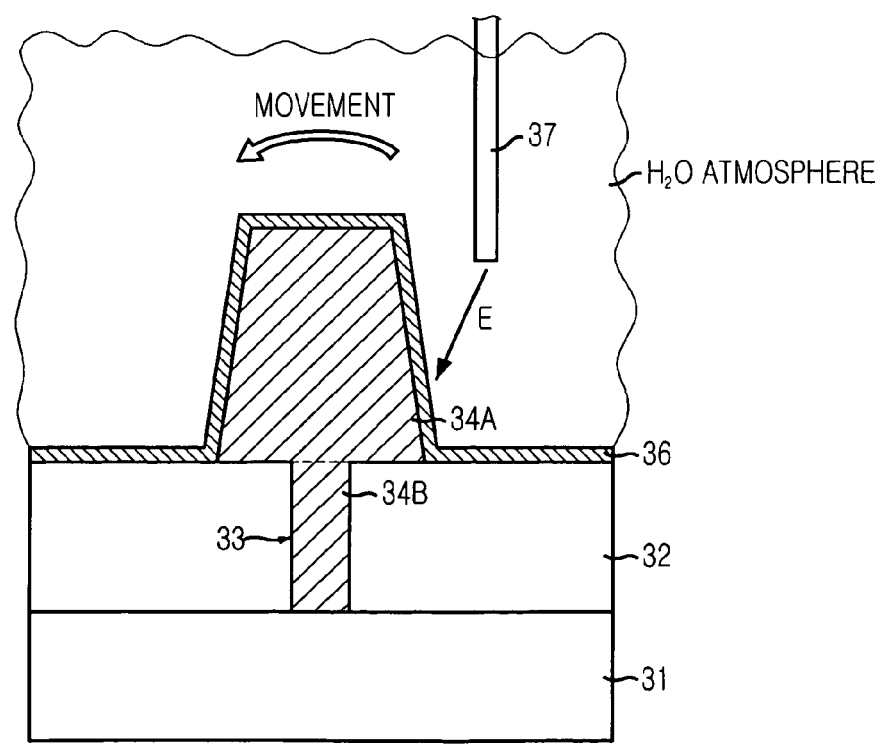

As shown in FIG. 3E, an electric field E is applied upon a surface in which the tantalum layer 36 is deposited through an atomic force microscopy (AFM) tip 37 under an oxidizing atmosphere, i.e., an $H_2O$ atmosphere.

Figure 3F:
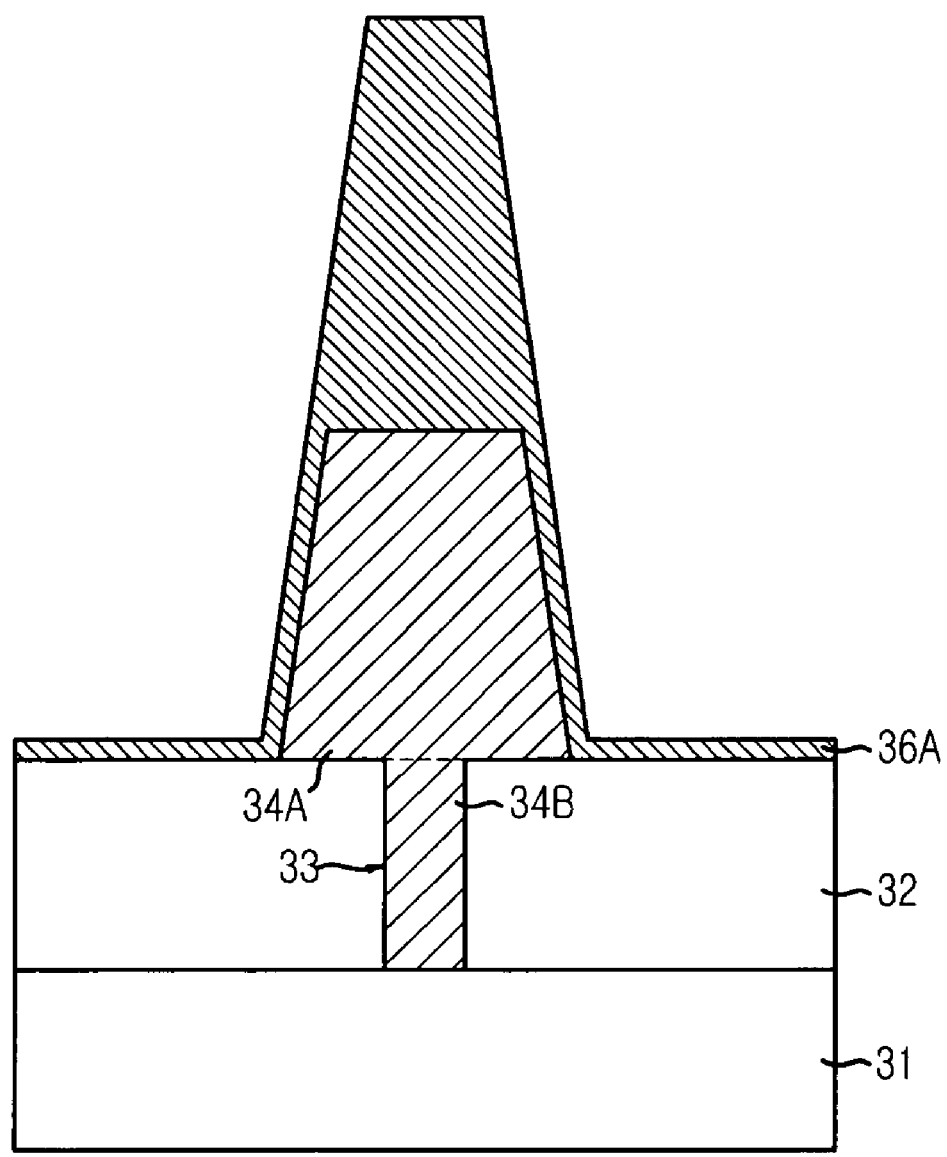

As shown in FIG. 3F, due to the electric field E, the tantalum layer 36 is oxidized and thus, a tantalum oxide layer 36A is formed over the storage node 34A. At this time, a partial pressure of $H_2O$ ranges from approximately 1% to approximately 100% under the oxidizing atmosphere, and a voltage applied to the AFM tip 37 ranges from approximately 5 V to approximately 30 V.

The tantalum oxide layer 36A, formed by applying the electric field E to the tantalum layer 36 with a voltage to the AFM tip 37 has a single crystal structure instead of a polycrystalline structure. For reference, a tantalum oxide layer formed through a typical deposition method has a polycrystalline structure.

The tantalum oxide layer 36A is formed in a uniform thickness over the sidewall of the storage node 34A. However, the tantalum oxide layer 36A has a peak in an upper portion of the storage node 34A and thus, the tantalum oxide layer 36A is formed thickly over the upper portion of the storage node 34A. The reason why the tantalum oxide layer 36A has a peak in the upper portion of the storage node 34A is because the electric field E is applied which the AFM tip 37 is moving when being used.

Figure 3G:
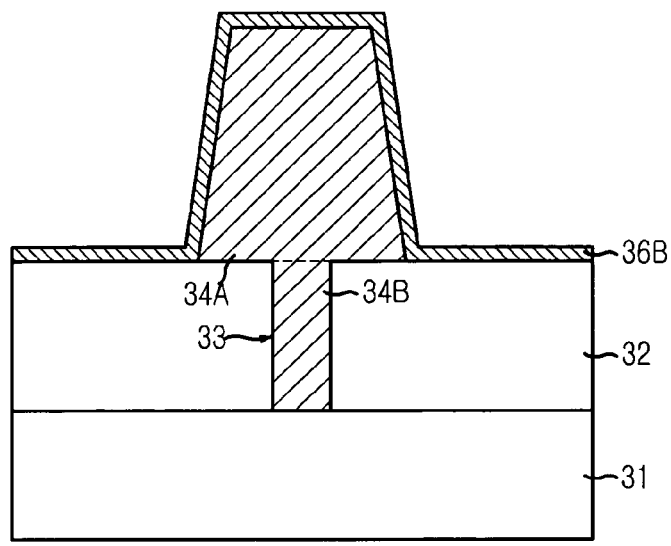

Referring to FIG. 3G, a planarization process is performed to obtain a planarized tantalum oxide layer 36B with a uniform thickness over the entire surface of the storage node 34A by removing the peaked portion of the tantalum oxide layer 36A. A chemical mechanical polishing (CMP) process is one example of the planarization process.

Figure 3H:
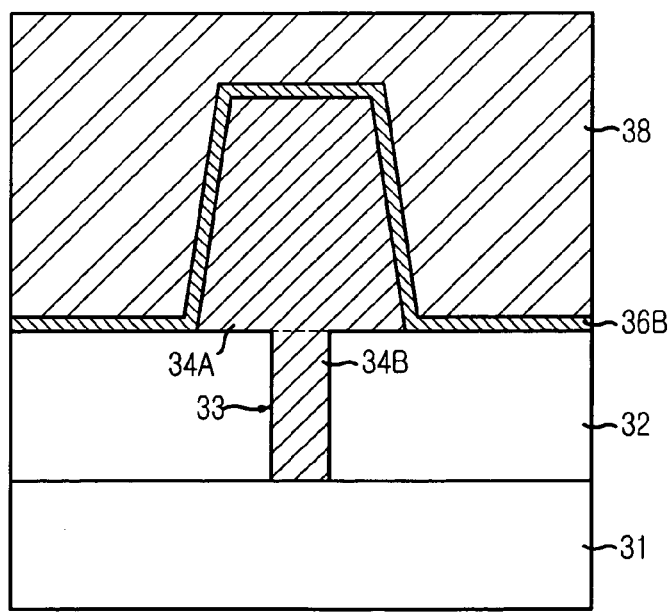

As shown in FIG. 3H, a plate 38 is formed over the planarized tantalum oxide layer 36B. The plate 38 includes one selected from polycrystalline silicon, single crystal silicon, titanium nitride (TiN), titanium (Ti), ruthenium (Ru), and tungsten (W).

In accordance with the specific embodiment of the present invention, although polycrystalline silicon is used as the storage node 34A, which also serves a role as the SN contact 34B, the storage node 34A can be formed using one of single crystal silicon, TiN, Ti, Ru, and W.

Also, a scanning probe microscopy (SPM) tip can be used in addition to the AFM tip for forming the tantalum oxide layer 36A of single crystal silicon. In case of using the SPM tip, it is possible to obtain the tantalum oxide layer of single crystal silicon. As the oxidizing atmosphere, $O_2$ plasma can be used in addition to the $H_2O$ atmosphere.

In accordance with the specific embodiment of the present invention, since it is possible to secure a sufficient capacitor capacitance although a height of a capacitor is reduced by using a tantalum oxide layer having a high dielectric constant compared to that of a concave type capacitor formed by using a dielectric layer with a structure of $HfO_2/Al_2O_3/HfO_2$, processes used to increase the height of the capacitor can be omitted, thereby simplifying the process.

In accordance with the specific embodiment of the present invention, a capacitor is formed in a stack structure instead of a concave type and thus, it is not necessary to use a storage node (SN) nitride layer.

In accordance with the specific embodiment of the present invention, since a tantalum oxide layer with single crystal is used, it is possible to reduce a leakage current through a crystallized interface.

In accordance with the specific embodiment of the present invention, it is not necessary to use a Ti layer and a TiN layer as a barrier metal layer.

Furthermore, in accordance with the specific embodiment of the present invention, since a tantalum oxide layer with single crystal using an AFM tip is grown quantitatively in a predetermined condition, it is possible to easily control a thickness.

The present application contains subject matter related to the Korean patent application No. KR 2005-0058566, filed in the Korean Patent Office on Jun. 30, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a capacitor comprising:
    forming an inter-layer insulation layer over a substrate;
    etching the inter-layer insulation layer to form a contact hole exposing a predetermined portion of the substrate;
    forming a storage node over the inter-layer insulation layer by filling the contact hole to serve as a storage node contact;
    forming a tantalum layer over the storage node;
    transforming the tantalum layer into a tantalum oxide layer of single crystal by applying an electric field upon the tantalum layer by giving a voltage to a tip under an oxidizing atmosphere; and
    forming a plate over the tantalum oxide layer.

2. The method of claim 1, wherein the tip includes one of an atomic force microscopy (AFM) tip and a scanning probe microscopy (SPM) tip.

3. The method of claim 1, wherein the oxidizing atmosphere includes one of $H_2O$ plasma of which partial pressure ranges from approximately 1% to approximately 10%, and $O_2$ plasma.

4. The method of claim 1, wherein the voltage ranges from approximately 5 V to approximately 30 V.

5. The method of claim 1, wherein the tantalum layer is formed by one of a sputtering method, a chemical vapor deposition (CVD) method, and an atomic layer deposition (ALD) method.

6. The method of claim 1, wherein the forming of the storage node includes:
    forming a conductive layer over the inter-layer insulation layer until the contact hole is filled;
    forming a mask over the conductive layer;
    etching the conductive layer with use of a mask as an etch barrier to form the storage node serving a role as the storage node contact; and
    removing the mask.

7. The method of claim 6, wherein sidewalls of the storage node are sloped in an angle ranging from approximately 5° to approximately 60°.

8. The method of claim 6, wherein the storage node and the plate are formed using one of polycrystalline silicon, single crystal silicon, TiN, Ti, Ru and W.

9. The method of claim 1, wherein the storage node and the plate are formed using one of polycrystalline silicon, single crystal silicon, TiN, Ti, Ru and W.

* * * * *

UNITED STATES PATENT AND TRADEMARK OFFICE
CERTIFICATE OF CORRECTION

PATENT NO. : 7,364,979 B2  Page 1 of 1
APPLICATION NO. : 11/411568
DATED : April 29, 2008
INVENTOR(S) : Do-Hyung Kim It is certified that error appears in the above-identified patent and that said Letters Patent is hereby corrected as shown below:

On the Title page & Col. 1 line 1
In Item [54], line 1, please delete "CAPCITOR" and insert -- CAPACITOR --.

Signed and Sealed this

Twenty-sixth Day of May, 2009

JOHN DOLL
*Acting Director of the United States Patent and Trademark Office*